United States Patent [19]

Fraas

[11] Patent Number: 5,439,532
[45] Date of Patent: Aug. 8, 1995

[54] CYLINDRICAL ELECTRIC POWER GENERATOR USING LOW BANDGAP THERMOPHOTOVOLATIC CELLS AND A REGENERATIVE HYDROCARBON GAS BURNER

[75] Inventor: Lewis M. Fraas, Issaquah, Wash.

[73] Assignee: JX Crystals, Inc., Issaquah, Wash.

[21] Appl. No.: 260,910

[22] Filed: Jun. 15, 1994

Related U.S. Application Data

[63] Continuation-in-part of Ser. No. 47,477, Apr. 19, 1993, Pat. No. 5,383,976, which is a continuation-in-part of Ser. No. 906,452, Jun. 30, 1992, Pat. No. 5,312,521.

[51] Int. Cl.[6] ..................... H01L 31/058; H02N 6/00
[52] U.S. Cl. .................................................. 136/253
[58] Field of Search .......................................... 136/253

[56] References Cited

U.S. PATENT DOCUMENTS

| | | | |
|---|---|---|---|
| 4,707,560 | 11/1987 | Hottel et al. | 136/253 |
| 4,776,895 | 10/1988 | Goldstein | 136/253 |
| 4,906,178 | 3/1990 | Goldstein et al. | 431/79 |
| 4,976,606 | 12/1990 | Nelson | 431/79 |
| 5,091,018 | 2/1992 | Fraas et al. | 136/246 |
| 5,096,505 | 3/1992 | Fraas et al. | 136/246 |
| 5,312,521 | 5/1994 | Fraas et al. | 136/253 |
| 5,356,487 | 10/1994 | Goldstein et al. | 136/253 |
| 5,383,976 | 1/1995 | Fraas | 136/253 |

OTHER PUBLICATIONS

Fraas, A. P. Heat Exchanger Design Operating on Radiant Energy, Wiley–Interscience Publication, pp. 365–382 (U.S.A. 1989).

Fraas, A. P., Characteristics of Heat Sources, Engineering Evaluation of Energy System, pp. 96–125 McGraw–Hill (U.S.A. 1982).

Pelka, D. G. et al., Natural Gas-Fired Thermophotovolatic System, Proceedings of the 32nd International Power Soruces, pp. 110–123 (USA 1986).

Morgan, M. D. et al., Radioisotope Thermal Photovolatic Application of GaSb Solar Cell, NASA Sprat Conference, pp. 349–358 (U.S.A. 1989).

Doellner, O. L., Aircraft Photovolatic Power-Generating System, PhD Thesis University of Arizona, (U.S.A. 1991).

Fraas, A. P. Design and Development Tests of Direct–Condensing Potassium Radiators, USAEC Report Conf-651026 (U.S.A. 1965).

Tester, et al., Comparative Performance Charactistics of Cylindrical Parabolic and Flat Plate Solar Energy Collectors, American Society of Mechanical Engineers, pp. 1–3 (U.S.A. 1974).

Fraas, A. P., Effects of Directed and Kinetic Energy Weapons on Spacecraft, Oak Ridge National Laboratory, pp. 1–76 (U.S.A. 1986).

(List continued on next page.)

*Primary Examiner*—Aaron Weisstuch
*Attorney, Agent, or Firm*—James Creighton Wray

[57] ABSTRACT

In the present invention, we describe a simple ceramic gas burner for use in a cylindrical thermophotovoltaic generator in which the burner and IR emitter section consist of three concentric ceramic tubes, with the largest tube being the outer exhaust tube. Fuel and a small amount of primary air are injected from the bottom of the smallest tube and exit at the top of the infrared emitter section where they combine with secondary air coming down through a second ceramic tube with an intermediate diameter open at the bottom of the emitter section. Ignition is initiated at the bottom of this air injector tube. After ignition, combustion then moves up to the top of the fuel injector tube. The exhaust gases then pass down from the top of the emitter section inside the mid diameter tube to the bottom end of the emitter section and then back up between the mid diameter tube and the outer tube to the top of the emitter section. This double pass allows for both efficient heat transfer to the emitter and for a uniform heat transfer along the length of the emitter. This open ended tube design allows for a high conductance low pressure burner design using off-the-shelf ceramic tubing.

9 Claims, 2 Drawing Sheets

OTHER PUBLICATIONS

Fraas, et al., Summary of the Research and Development Effort on Ceramic Gas Turbines, Oak Ridge National Laboratories, pp. 1–33 (U.S.A. 1977).

Howe, E. D. et al., The Characteristics of Atmospheric-Type Burners when Used with Natural Gas, Transactions of the A.S.M.E., pp. 673–677 (U.S.A. 1940).

Fraas, A. P., Magneto-Hydrodynamic Systems, Engineering Evaluation Of Energy Systems, pp. 437–461, McGraw-Hill, Inc., 1982.

Day, A., et al., Application of the GaSb Solar Cell in Isotope-Heated Power Systems, Conference Record, 21st IEEE Photovolatic Specialists, Conf. Kissimmee, pp. 1320–1325, Fla. 1990.

Kittl and Guazzoni, Design Analysis of TPV-Generator System, Proc. 25th Annual Power Sources Conf., pp. 106–110 (U.S.A. 1972).

Woolf, L. D. Optimum Efficency of Single and Multiple Bandgap Cells in Thermoplastic Energy Conversion, Solar Cells, 19, pp. 19–20 (U.S.A. 1986–1987).

CYLINDRICAL ELECTRIC POWER GENERATOR USING LOW BANDGAP THERMOPHOTOVOLTAIC CELLS AND A REGENERATIVE HYDROCARBON GAS BURNER

REFERENCE TO RELATED APPLICATION

This application is a continuation-in-part of U.S. patent application Ser. No. 08/047,477, filed, Apr. 19, 1993, now U.S. Pat. No. 5,383,976, which was a continuation-in-part of U.S. patent application Ser. No. 07/906,452, filed Jun. 30, 1992, now U.S. Pat. No. 5,312,521. These earlier applications and their listed references are incorporated herein by reference.

BACKGROUND

Various attempts to fabricate practical and economical thermophotovoltaic (TPV) power generators have been reported over the years. However, generator designs based on the use of silicon photovoltaic cells have been unsuccessful because of a requirement for very high temperature emitters (T>2300 K). Without very high temperature emitters, TPV systems based on silicon cells are both inefficient and operate at low power densities. Selective emitters based on rare earth oxides have been described (M. K. Goldstein, U.S. Pat. No. 4,976,606) which improve efficiencies but still suffer from low power densities at practical emitter temperatures. Low power density generators are not economical for large volume energy production.

In 1989, L. M. Fraas et. al. described a new GaSh photovoltaic cell sensitive in the infrared (IR) out to 1.8 microns. Later in 1989, M. D. Morgan, W. E. Horne, and A. C. Day proposed using GaSh cells in combination with a radioisotope thermal source for space electric power and in 1991, O. L. Doeliner proposed using GaSb cells looking at jet engine plumes to replace alternators on jet aircraft. Finally in 1992, A. P. Fraas and R. M. Fraas submitted U.S. patent application Ser. No. 07/906,452 describing a small, quiet, natural gas fired TPV generator using GaSb cells. Improvements on this natural gas fired TPV generator were subsequently described in a continuation-in-part U.S. patent application Ser. No. 08/047,477, filed Apr. 19, 1993.

These two applications describe a TPV generator in which multiple low bandgap photovoltaic cell strings are mounted around the perimeter of a cylinder parallel to a central cylindrical emitter, or IR radiator. The cell strings face radially inward to receive IR radiation from the emitter and efficiently convert this radiation into electric power. Shod pass IR filters are located between the emitter and the cells to pass the useful shorter wavelength IR on to the cells while reflecting the longer wavelength IR back to the emitter. A regenerator is located at the top of the burner/emitter so that the exhaust gases preheat the supply air, allowing for a higher flame temperature thereby making more short wavelength IR available to the photovoltaic cells.

The emitter in the above cylindrical TPV generator is designed to operate at between 1700 and 2000K and at this temperature, both the burner and emitter must be fabricated using ceramics, not metals. Although it is possible to design a ceramic emitter/burner with a uniform emitter temperature along its length by using small flame jets from a central burner tube with the jet pattern tailored for staged fuel addition as was described in our earlier applications, complex ceramic shapes are only available through special fabrication orders at high prices with long lead times. There is a need for a simple burner/emitter design for use with a cylindrical TPV generator, preferably one that uses off-the-shelf ceramic tubing. A second problem with the flame jet design is the need for substantial combustion gas supply pressure to force fuel and air through the small jet orifices. There is a need for a burner design with high conductance and a small pressure drop.

SUMMARY OF THE INVENTION

The present invention relates to thermophotovoltaics and more particularly to the use of new low bandgap GaSb, GaInSb, GaInAs, GaInSbAs, or Ge photovoltaic cells sensitive to IR radiation down to 1.8 microns. These new cells allow the use of lower temperature (e.g. 1800K) ceramic thermal emitters. Previous silicon cells required the operation of man-made IR emitters at impractically high temperatures where materials problems severely limited emitter lifetimes. These new low bandgap cells can be wired in series strings and combined with hydrocarbon fired burner/emitter designs to create a variety of practical TPV electric generators. One such small TPV generator can serve as a compact, quiet, light weight, and clean burning De electric power supply for off-grid electric power for mountain cabins or third world village homes. A larger 10 kW unit could be used as a power system in electric vehicles where it could run cleaner than the internal combustion engine and reduce battery size and weight. All of these hydrocarbon fired TPV generator designs could use a simple low cost ceramic emitter/burner fabricated using off-the-shelf ceramic tubing.

In the present invention, we describe a simple ceramic gas burner for use in a cylindrical TPV generator, consisting of three concentric ceramic tubes. Fuel and a small amount of primary air are injected from the bottom of the smallest tube and exit at the top of the IR emitter section where they combine with secondary air coming down through a second ceramic tube with an intermediate diameter open at the bottom of the emitter section. Ignition is initiated at the bottom of this air injector tube. Exhaust gases then pass upward heating the largest diameter tube and the air injector tube. At a short time after ignition after the supply air and the ceramic tubes have been regeneratively heated, combustion then moves up to the top of the fuel injector tube. The exhaust gases then pass down from the top of the emitter section inside the mid diameter tube to the bottom end of the emitter section and then back up between the mid diameter tube and the largest diameter outer tube to the top of the emitter section. This double pass allows for both efficient heat transfer to the emitter and for a uniform heat transfer along the length of the emitter.

A first important feature of the present invention is the ease of fabrication of the ceramic emitter/burner in that it uses straight off-the-shelf ceramic tubing. A second important feature of the present invention is that it allows for a uniform emitter temperature along the length of the emitter. A third important feature of the present invention is the ease of burner ignition. A final important feature of this invention is the high conductance open end burner design with its associated low pressure drop.

These and other features of the invention will become more fully apparent from the claims, and from the description as it proceeds in conjunction with the appended drawings.

DETAILED DESCRIPTION OF PREFERRED EMBODIMENT

Figure 1:
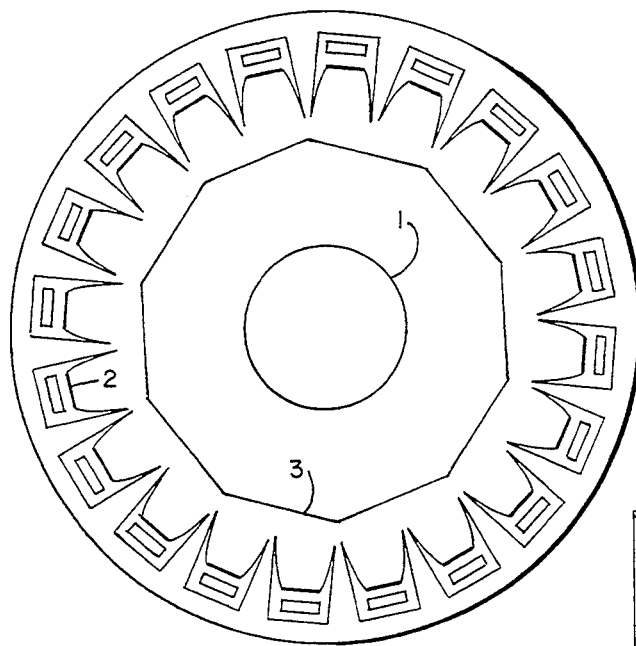
FIG. 1 shows a horizontal cross section perpendicular to the cylinder axis through the TPV generator.

FIG. 1 shows a horizontal cross section through our cylindrical TPV generator. The key elements are a central infrared emitter 1, low bandgap cell receivers 2, and a lantern containing IR filters 3.

Figure 2:
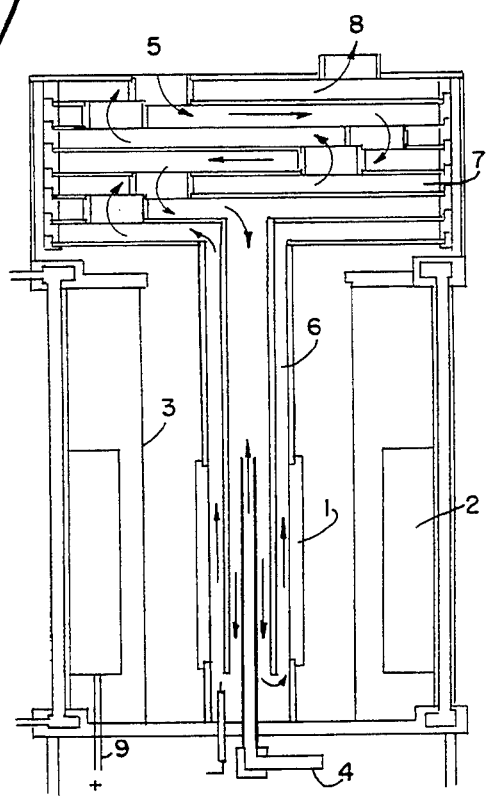
FIG. 2 shows a vertical cross section through the cylindrical TPV generator.

FIG. 2 shows a vertical cross section through our quiet, compact TPV electric power generator. IR from the emitter 1 is received by the low bandgap cell strings 2, and converted to electric power. The IR useful to the cells is selected by the IR filters 3. Hydrocarbon fuel is supplied at the bottom 4 and burned with air supplied from the air intake 5 to provide chemical energy in a burner which then is converted to radiant IR energy at the emitter 1. The exhaust gases from the burner first pass through a high temperature ceramic counter flow heat exchanger 6 and then through a lower temperature heat exchanger or regenerator section 7 exiting at the top chimney 8. Electric power is collected at terminals 9. This unit is about 8" in diameter and 16" high.

Figure 3:
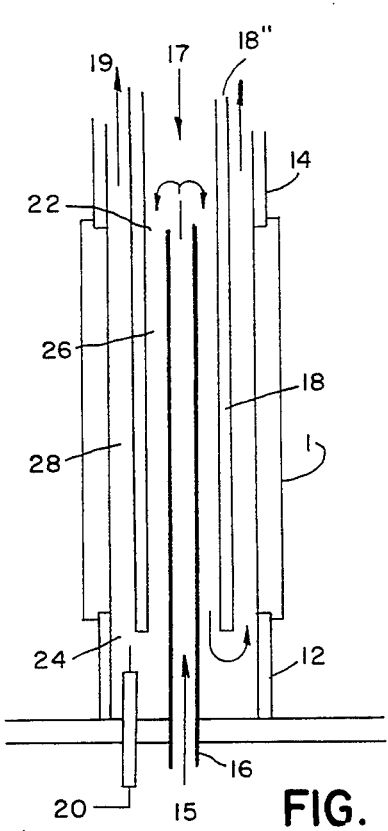
FIG. 3 shows a vertical cross section through the emitter/burner at the center of the TPV generator.

FIG. 3 shows the important burner/emitter section in more detail. It consist of an outer vertical emitter tube 1 with a small concentric fuel injector tube 16 passing through it from the bottom and a second concentric intermediate diameter air tube 18 passing through it from the top. The emitter tube rests on the bottom support tube 12 and couples to tube 14 at its top end. Fuel 15 with a small amount of primary air exits at the top end of tube 16 and mixes with secondary air 17 moving downward through tube 18. The resultant combustible mixture is ignited by a spark from the ignitor 20 in region 24. Ignition in region 24 occurs easily because the cold tube walls are a good distance away. The high temperature exhaust gases then rise through region 28, heating tubes 1 and 18. After a preheat time interval and given the right amount of fuel and primary and secondary air, the combustion then moves up toward the top of the fuel injector tube 16 to region 22. From then on, the hot combustion gases travel first down through region 26 and then up through region 28, providing for a double pass heat transfer to the burner/emitter section. The exhaust gases then travel up through region 19, coupling heat to the secondary air 17 through the upper part of the air supply tube 18''. Tubes 14 and 18'' constitute the counter flow heat exchanger 6 in FIG. 2. In our preferred embodiment, tubes 16, 12, and 14 are made from alumina and tubes 1 and 18 are fabricated with silicon carbide.

Figure 4:
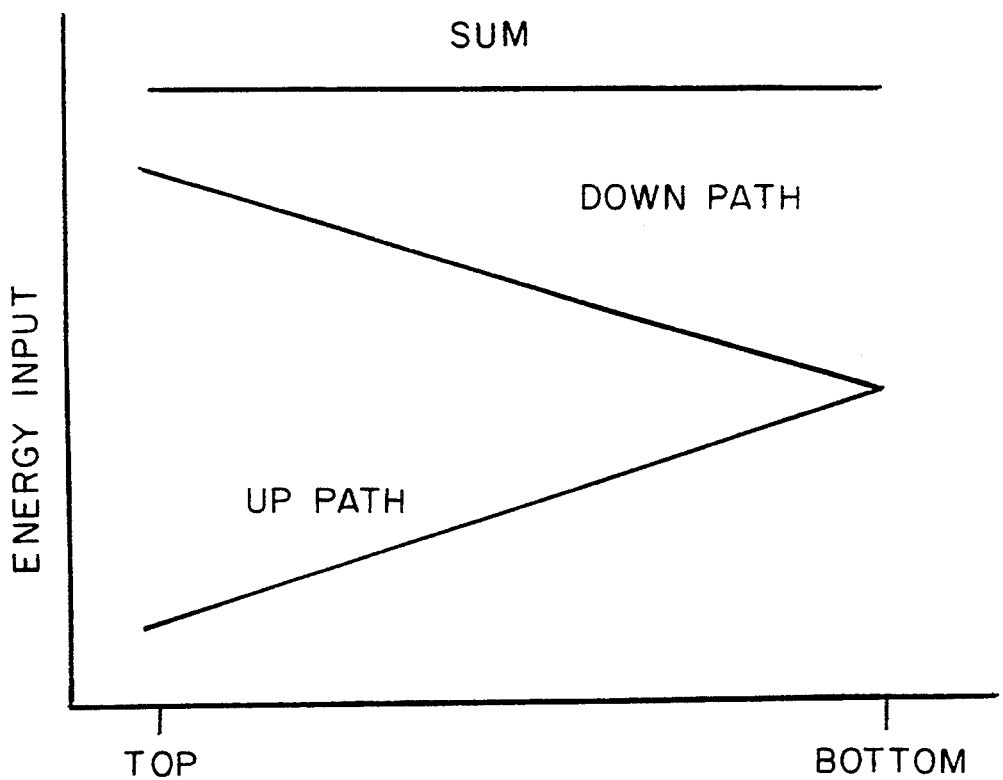
FIG. 4 shows the energy released by the combustion exhaust gases for the downward flowing path, the upward flowing path, and their sum along the length of the emitter section.

An important feature of the burner/emitter design of FIG. 3 is good temperature uniformity along the length of the emitter from bottom to top. The way this is brought about is illustrated in FIG. 4. Referring to FIG. 3, combustion occurs in region 22 where heat is released into the gas by chemical reaction. Referring to FIG. 4, more heat is coupled to the top end of tube 18 for the downward pass through region 26 than to the bottom end. The opposite is true for the upward pass. During the upward pass through region 28, more heat is transferred to the bottom end than the top end. By adjusting the diameters of tubes 16, 18, and 1, the slope of the downward pass heat transfer can be set equal in magnitude but opposite in sign to the slope for the upward pass. In the above argument, we note that heat transferred to the air supply tube 18 by hot gas contact can be considered as being immediately transferred to the emitter by radiation transfer. Another feature of our design which promotes emitter temperature uniformity is the fact that the emitter wall is relatively thick for available silicon carbide tubing. This thick wall along with the excellent thermal conductivity of silicon carbide enhances temperature uniformity.

Figure 5:
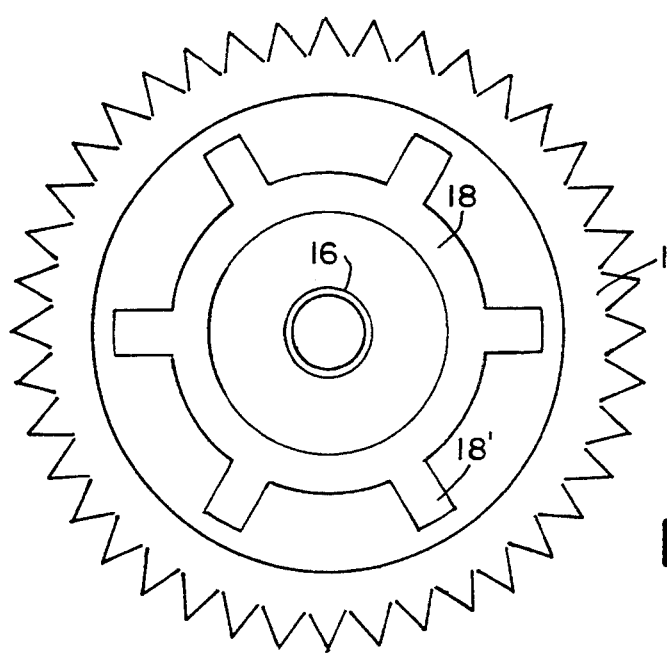
FIG. 5 shows a horizontal cross section through the emitter/burner.

Although the simplest burner/emitter design uses off-the-shelf ceramic tubing, there are also some straight forward design variations which can add substantially to heat transfer without undue fabrication complexities. FIG. 5 shows some additional easily added features. For example, referring to the emitter 1 in FIG. 5, the emitter surface can be modified with a large number of vertical grooves as shown. Referring next to the air tube 18, fins 18' can be added to increase the gas contact surface area. Furthermore, if these fins wind helically upward, the exhaust path length can be substantially lengthened. further enhancing heat transfer.

Referring again to FIG. 3, there is an alternative useful and functional burner/emitter design in which the mid diameter tube 18 serves both as the air injector tube and as the IR emitter tube and the outer largest diameter tube 1 is made from an IR transparent material such as fused silica or sapphire. This configuration produces a smaller diameter IR emitter.

Various changes and alterations may be made without parting from the spirit of this invention. All changes and modifications which fall within the scope of the claims and equivalents thereof are intended to be embraced thereby.

I claim:

1. A thermophotovoltaic electric generator in which a hydrocarbon gas fuel and air mixture is burned in a central vertical cylindrical burner/emitter, resulting in the emission of infrared radiation which is received by low bandgap photovoltaic cells and converted to electric power, wherein said burner/emitter is comprised of three concentric ceramic tubes, an outer emitter tube, an inner fuel injector tube, and a mid diameter air injector tube, where both the air and fuel injector tubes pass through the emitter tube, said fuel injector tube being open at its top end and said air injector tube being open at its bottom end, wherein combustion in steady state occurs at the top of the fuel injector tube and the hot combustion gases then travel downward between the fuel and air injector tubes and then upward between the air and emitter tubes, wherein the three tube diameters and lengths are adjusted to achieve a uniform temperature along the length of the emitter tube.

2. The thermophotovoltaic apparatus of claim 1 wherein the emitter tube and the air injector tube are fabricated from silicon carbide.

3. The thermophotovoltaic apparatus of claim 1 wherein an ignitor is located just below the bottom end of the air injector tube.

4. The thermophotovoltaic apparatus of claim 1 wherein a ceramic tube equal in inner diameter with the emitter tube and joining it extends upward concentric with the air injection tube, forming a counter flow ceramic heat exchanger wherein the hot exhaust gases preheat the supply air.

5. The thermophotovoltaic apparatus of claim 1 wherein the air injector tube has multiple fins extending outward radially into the gap between the air injector tube and the emitter tube to increase hot gas contact surface area.

6. The thermophotovoltaic apparatus of claim 5 wherein the fins wind helically around the air supply tube, thereby increasing the hot gas path length and increasing heat transfer from the hot gas to the emitter tube.

7. A thermophotovoltaic electric generator in which a hydrocarbon gas fuel and air mixture is burned in a central vertical cylindrical burner/emitter resulting in the emission of useful infrared radiation which is received by low bandgap photovoltaic cells and converted to electric power, wherein said burner/emitter is comprised of three concentric ceramic tubes, an outer tube transparent to said useful infrared radiation, an inner fuel injector tube, and a mid diameter air injector tube emitting said useful infrared radiation, where both the air and fuel injector tubes pass through the outer tube, said fuel injector tube being open at its top end and said air injector tube being open at its bottom end, wherein combustion in steady state occurs at the top of the fuel injector tube and the hot combustion gases then travel downward between the fuel and air injector tubes and then upward between the air and outer tubes, wherein the three tube diameters and lengths are adjusted to achieve a uniform temperature along the length of said air injector tube.

8. The thermophotovoltaic apparatus of claim 7 wherein the air injector tube emitting useful infrared radiation is made from silicon carbide.

9. The thermophotovoltaic apparatus of claim 7 wherein the outer tube transparent to useful infrared radiation is made from fused silica or sapphire.

* * * * *

UNITED STATES PATENT AND TRADEMARK OFFICE
CERTIFICATE OF CORRECTION

PATENT NO. : 5,439,532

DATED : August 8, 1995

INVENTOR(S) : Lewis M. Fraas

It is certified that error appears in the above-identified patent and that said Letters Patent is hereby corrected as shown below:

Column 1, line 31, change "GaSh" to --GaSb--;

line 34, change "GaSh" to --GaSb--.

Column 2, line 13, change "GalnSb, GainAs, GainSbAs" to

--GaInSb, GaInAs, GaInSbAs--.

Signed and Sealed this

Tenth Day of October, 1995

*Attest:*

BRUCE LEHMAN

*Attesting Officer*     *Commissioner of Patents and Trademarks*